United States Patent [19]

Hsu et al.

[11] Patent Number: 5,573,961
[45] Date of Patent: Nov. 12, 1996

[54] METHOD OF MAKING A BODY CONTACT FOR A MOSFET DEVICE FABRICATED IN AN SOI LAYER

[75] Inventors: Ching-Hsiang Hsu, Hsin Chu; Shyh-Chyi Wong, Taichang; Mong-Song Liang; Steve S. Chung, both of Hsinchu, all of Taiwan

[73] Assignee: Taiwan Semiconductor Manufacturing Company Ltd., Hsin-Chu, Taiwan

[21] Appl. No.: 565,201

[22] Filed: Nov. 9, 1995

[51] Int. Cl.$^6$ ............................................. H01L 21/265
[52] U.S. Cl. ........................... 437/21; 437/24; 437/26; 437/40; 437/44
[58] Field of Search ..................... 437/21, 24, 26, 437/40 AS, 40 TFT, 41 AS, 41 TFT, 44, 45

[56] References Cited

U.S. PATENT DOCUMENTS

| | | | |
|---|---|---|---|
| H986 | 11/1991 | Codella et al. | 437/41 AS |
| 4,078,947 | 3/1978 | Johnson et al. | 437/45 |
| 4,173,818 | 11/1979 | Bassous et al. | 437/41 AS |
| 4,946,799 | 8/1990 | Blake et al. | 437/41 TFT |
| 4,975,126 | 12/1990 | Margail et al. | 437/26 |
| 5,024,960 | 6/1991 | Haken | 437/44 |
| 5,185,280 | 2/1993 | Houston et al. | 437/44 |
| 5,294,821 | 3/1994 | Iwamatsu | 257/351 |
| 5,371,394 | 12/1994 | Ma et al. | 437/45 |
| 5,422,287 | 6/1995 | So | 437/41 TFT |
| 5,424,225 | 6/1995 | Yamaguchi et al. | 437/21 |
| 5,427,964 | 6/1995 | Kaneshiro et al. | 437/44 |
| 5,444,002 | 8/1995 | Yang | 437/44 |
| 5,510,279 | 4/1996 | Chien et al. | 437/40 AS |
| 5,514,611 | 5/1996 | Kim et al. | 437/44 |

*Primary Examiner*—Mary Wilczewski
*Assistant Examiner*—Brian K. Dutton
*Attorney, Agent, or Firm*—George O. Saile

[57] ABSTRACT

A process for fabricating a MOSFET device, on a silicon on insulator layer, in which a body contact to the silicon on insulator layer exists, has been developed. The process features creating a heavily doped P type body contact region in a lightly doped source and drain region of the MOSFET, via ion implantation through a metal silicide layer. The addition of the body contact results in more controllable device characteristics, in terms of drain currents, etc., than for counterparts fabricated in silicon on insulator layer, without the use of a body contact.

26 Claims, 4 Drawing Sheets

5,573,961

METHOD OF MAKING A BODY CONTACT FOR A MOSFET DEVICE FABRICATED IN AN SOI LAYER

BACKGROUND OF THE INVENTION

1. Field of the Invention

This present invention relates to the fabrication of a semiconductor device, and more specifically to a semiconductor device fabricated from silicon on insulator, (SOI) technology.

2. Description of Prior Art

The objective of the semiconductor industry is to continually decrease the cost of manufacturing semiconductor chips, while still increasing the performance of these same chips. Micro-miniaturazation, or the ability to create shapes and images with sub-micron dimensions, has allowed these objectives to be partially realized. Advances in specific semiconductor disciplines, such as photolithography, via more sophisticated exposure cameras, as well as more sensitive photoresist materials, have allowed sub-micron images, in photoresist layers, to be routinely obtained. In addition similar developments in the dry etching discipline has allowed these sub-micron images in photoresist to be accurately transferred to underlying semiconductor materials, used for the fabrication of advanced devices. The creation of sub-micron shapes allow for the fabrication of smaller chips, resulting in more chips per wafer, and thus reducing costs. In addition smaller shapes result in a decrease in junction capacitance, as well as specific resistances, thus also improving device performance.

Although micro-miniaturazation has allowed the cost and performance objectives to be partially met, the semiconductor industry continues to evaluate additional methods to surpass these objectives. The development of silicon on insulator, (SOI), has resulted in significant performance improvements, when compared to counterparts fabricated using conventional processes. The SOI technology, in which devices are fabricated in a thin layer of silicon, which in turn overlies an insulator, removes a large portion of the diffusion to substrate parasitic capacitance, thus resulting in device performance benefits. Metal oxide semiconductor field effect transistors, (MOSFET), have been fabricated using SOI concepts. For example Houston, et al, in U.S. Pat. No. 5,185,280, as well as Iwamatsu, et al, in U.S. Pat. No. 5,294,281, have described methods for fabricating MOSFETs using SOI. However specific fabrication steps, needed to contact specific regions of a MOSFET device, to avoid deleterious device characteristics, have not been shown. For example a MOSFET fabricated without direct contact to a channel region, or with a body floating, will experience a "kink" effect, or suffer from a low, source to drain breakdown voltage, $BV_{ds}$. MOSFETs fabricated with body contacts, in the past, have added considerable complexity and cost to the process, in terms of additional layers. This invention will describe a process for providing a body contact to a MOSFET chip, by only including a masking and ion implantation sequence, to the MOSFET fabrication process flow.

SUMMARY OF THE INVENTION

It is an object of this invention to fabricate MOSFET devices in an SOI layer.

It is another object of this invention to provide a body contact to the SOI layer.

It is yet another object of this invention to provide a process sequence which allows for a compatible incorporation of the body contact structure, into the MOSFET process flow.

It is still yet another object of this invention to use an heavily doped P type region, obtained via ion implantation through a metal silicide layer, into the SOI layer, as the body contact.

In accordance with the present invention a P type, single crystalline, silicon layer is present on a silicon oxide layer, which in turn resides on a semiconductor substrate. Thick field oxide regions are thermally grown for purposes of isolation, followed by the growth of a thin silicon dioxide film, to be used as the MOSFET gate oxide. A polysilicon layer is grown, doped via ion implantation processes, and patterned to produce a polysilicon gate structure. A lightly doped, N type, source and drain region is formed via ion implantation processing. An insulator sidewall spacer is formed on the sides of the polysilicon gate structure by first depositing an insulator, and then using anisotropic etching to create the insulator spacer. A photoresist masking step is used to blockout only a specific region, of a specific MOSFET device, from a heavily doped, N type, ion implantation, used to create the source and drain regions of the MOSFET devices. A titanium layer is next deposited, and subjected to annealing cycles, used to create the metal silicide in regions in which titanium interfaced silicon. Unreacted titanium, existing in regions where titanium interfaced insulator, is removed using selective wet etchants. A layer of silicon oxide is deposited, followed by patterning used to open contact holes to the all heavily doped N type, source and drain regions, as well as opening a contact hole to the region that will used for the body contact, that did not receive the heavily doped, N type process. Another photoresist masking step is then used, to expose the region that was previously blocked from the heavily doped N type ion implantation, but now is subjected to a heavily doped, P type ion implantation, to create the body contact region. A rapid thermal anneal cycle is used to drive in the P type spices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
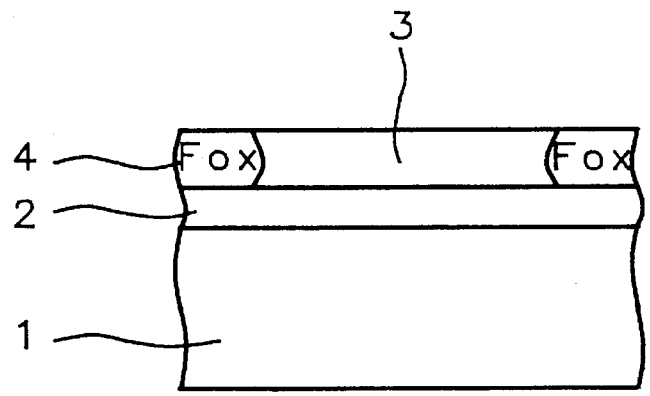
FIGS. 1–6, which schematically, in cross-sectional style, shows specific stages of fabrication for MOSFET devices, in SOI, with a body contact.

The method of creating MOSFET devices, with body contacts to an SOI layer, will now be described. FIG. 1, shows a starting substrate, 1, with a silicon oxide region, 2, and a silicon on insulator layer, 3. The method used to produce the silicon on insulator layer, (SOI), is SIMOX, (Separation by IMplanted OXygen). This method results in a buried oxide layer, 2, of between about 3000 to 4000 Angstroms of silicon oxide, with an overlying silicon on insulator layer, 3, (SOI), of between about 1000 to 2000 Angstroms of single crystalline silicon. The SOI layer, 3, has a resistivity between about 15 to 25 ohm-cm, with a defect density of less than about 1E4 defects/cm$^2$.

Next a thick field oxide region, 4, (FOX), is grown for purposes of isolation. The FOX region is created by patterning a composite layer of underlying thermally grown, $SiO_2$, and an overlying chemically vapor deposited $Si_3N_4$ layer, using conventional photolithography and dry etching processing. After photoresist removal, via plasma oxygen ashing, followed by careful wet cleans, the composite insulator layer is used as an oxidation mask, and between about 2000 to 6000 Angstroms of FOX is thermally grown in a oxygen—steam ambient, at a temperature between about 900° to 1150° C. This is shown in FIG. 1.

Figure 2:
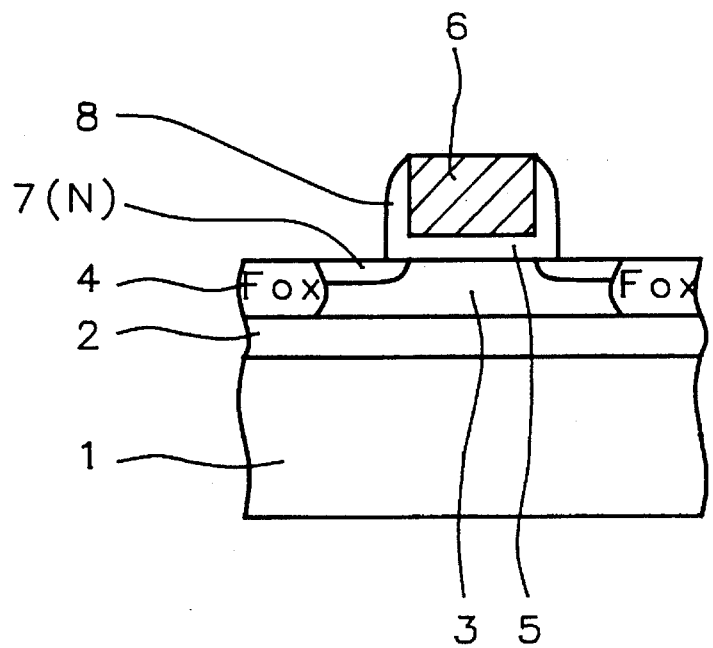

After removal of the composite insulator oxidation mask, using hot phosphoric acid for the $Si_3N_4$ layer, and hydrofluoric acid for the underlying $SiO_2$ layer, a thin silicon dioxide layer, 5, is regrown, at a temperature between about 800° to 1000° C., to a thickness between about 40 to 200 Angstroms, to be used as the gate insulator for the MOSFET device. This is shown in FIG. 2. A polysilicon layer is next deposited using low pressure chemical vapor deposition, (LPCVD), processing, at a temperature between about 500° to 650° C., to a thickness between about 1200 to 3000 Angstroms. An ion implantation of phosphorous, at an energy between about 50 to 100 Kev., at a dose between about 1E14 to 1E16 atoms/cm$^2$, is used for doping purposes. Standard photolithographic and reactive ion etching, (RIE), procedures, using $Cl_2$ as an etchant, are employed to form the polysilicon gate structure, 6, shown schematically in FIG. 2. After photoresist removal using plasma oxygen ashing, followed by careful wet cleans an ion implantation of phosphorous is performed at an energy between about 30 to 80 Kev., at a dose between about 1E12 to 1E14 atoms/cm$^2$, to create the N type, lightly doped source and drain regions, 7. An insulator sidewall spacer, 8, is next created on the sides of polysilicon gate structure, 6. The spacer is formed by initially depositing a layer of silicon oxide using either LPCVD or plasma enhanced chemical vapor deposition, (PECVD), processing, at a temperature between about 600° to 800° C., to a thickness between about 800 to 2500 Angstroms. A selective, anisotropic, RIE procedure, using $CHF_3$ as an etchant, is used to create insulator sidewall spacer, 8. The RIE procedure is selective, therefore N type, lightly doped source and drain regions, 7, are not etched during this procedure. This again is shown in FIG. 2.

Figure 3:
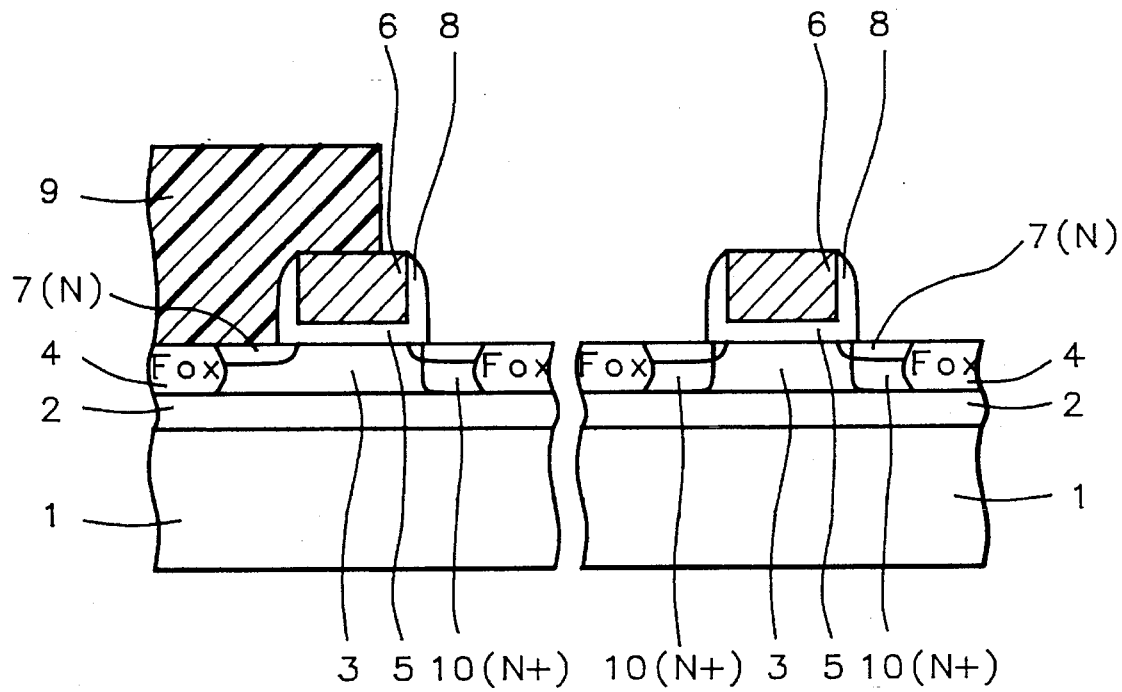

FIG. 3, will now show the formation of a specific MOSFET, to be used to provide body contact for the all the other MOSFETs in the chip. First a photoresist masking layer, 9, is used to blockout the region of the MOSFET that will be used to provide body contact. Next heavily doped, N type, source and drain regions, 10, are created, except in the blockout region where the body contact will be subsequently formed. The heavily doped source and drain regions, 10, are created via ion implantation of arsenic, at an energy between about 30 to 80 Kev., at a dose between about 1E14 to 1E16 atoms/cm$^2$. After photoresist removal via plasma oxygen ashing, followed by careful wet cleans, an anneal at a temperature between about 850° to 920° C., using a conventional furnace, is performed to drive in the source and drain regions.

Figure 4:
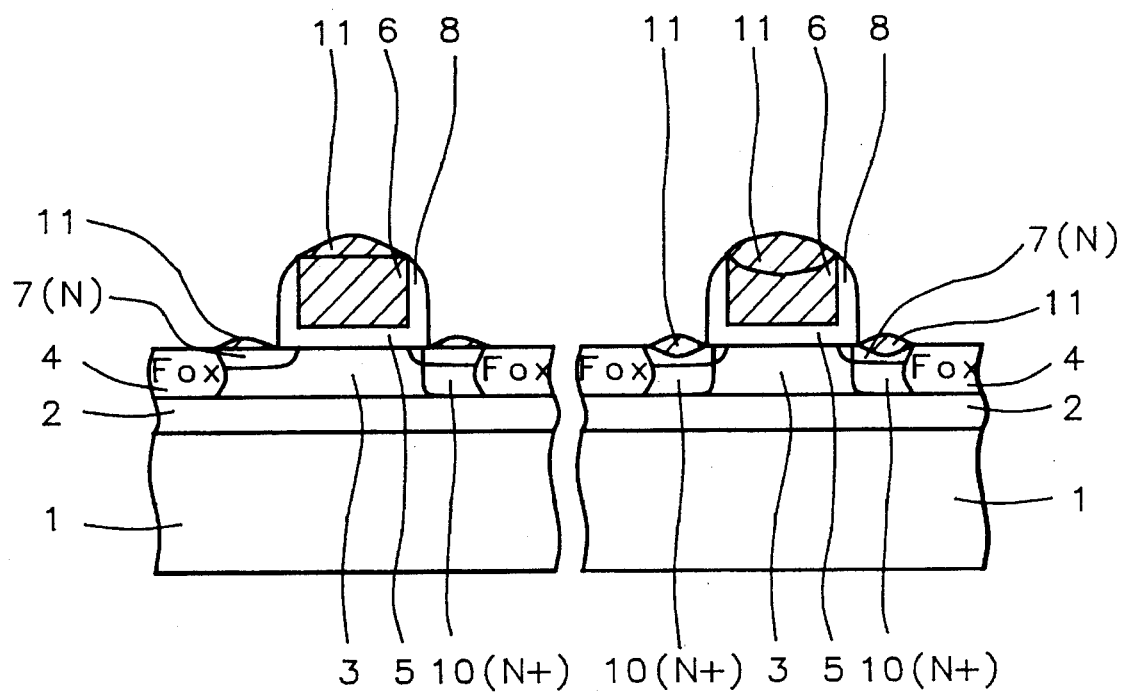

A dilute hydrofluoric acid treatment is than used to remove any native oxide films, followed by deposition of a layer of titanium, using r.f. sputtering, to a thickness between about 200 to 300 Angstroms. An anneal is performed to convert the titanium, interfacing silicon, to titanium silicide layer. The titanium that on insulator remains unreacted. The anneal can be performed in a conventional furnace, at a temperature between about 500° to 700° C., for a time between about 10 to 30 min., in an argon ambient. The conversion to a titanium silicide layer can also be accomplished via rapid thermal annealing processes, at a temperature between 600° to 900° C., for a time between about 30 to 120 sec. The resulting titanium silicide layer, 11, is between about 500 to 750 Angstroms. The unreacted titanium is than removed in a solution of about 5 parts water, to about 1 part hydrogen peroxide, and about 1 part ammonium hydroxide, at a temperature between about 50° to 75° C. This is schematically shown in FIG. 4.

Figure 5:
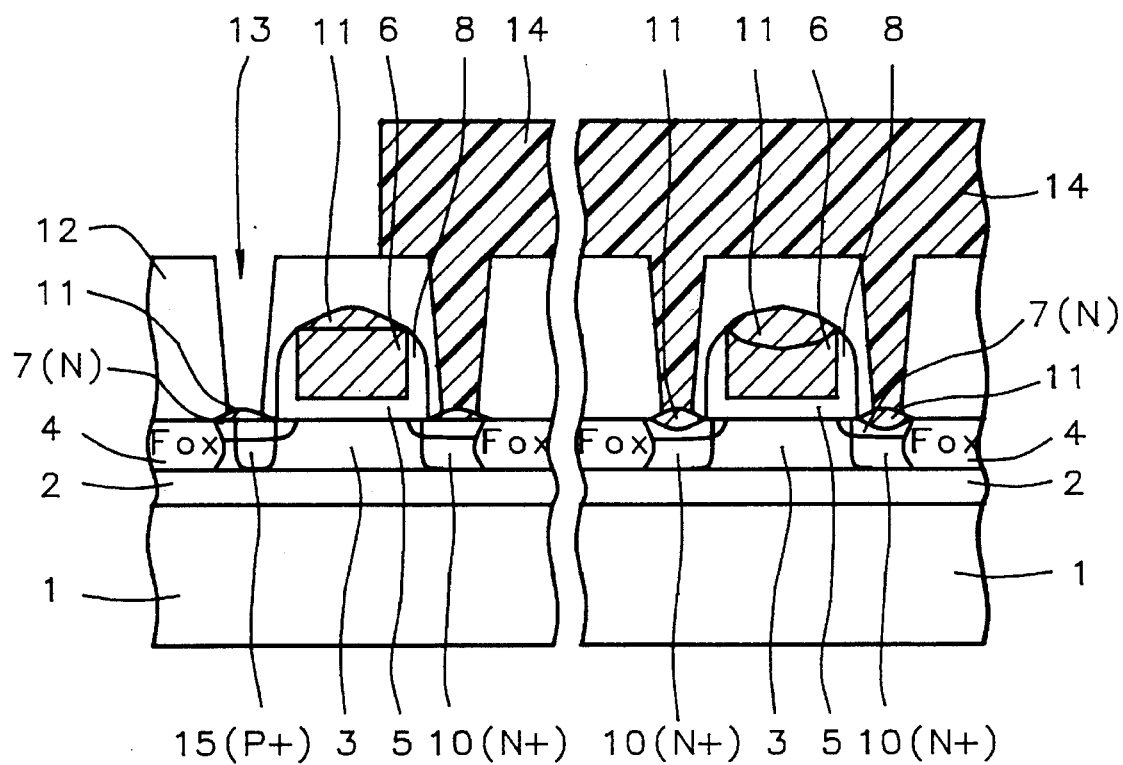
Figure 6:
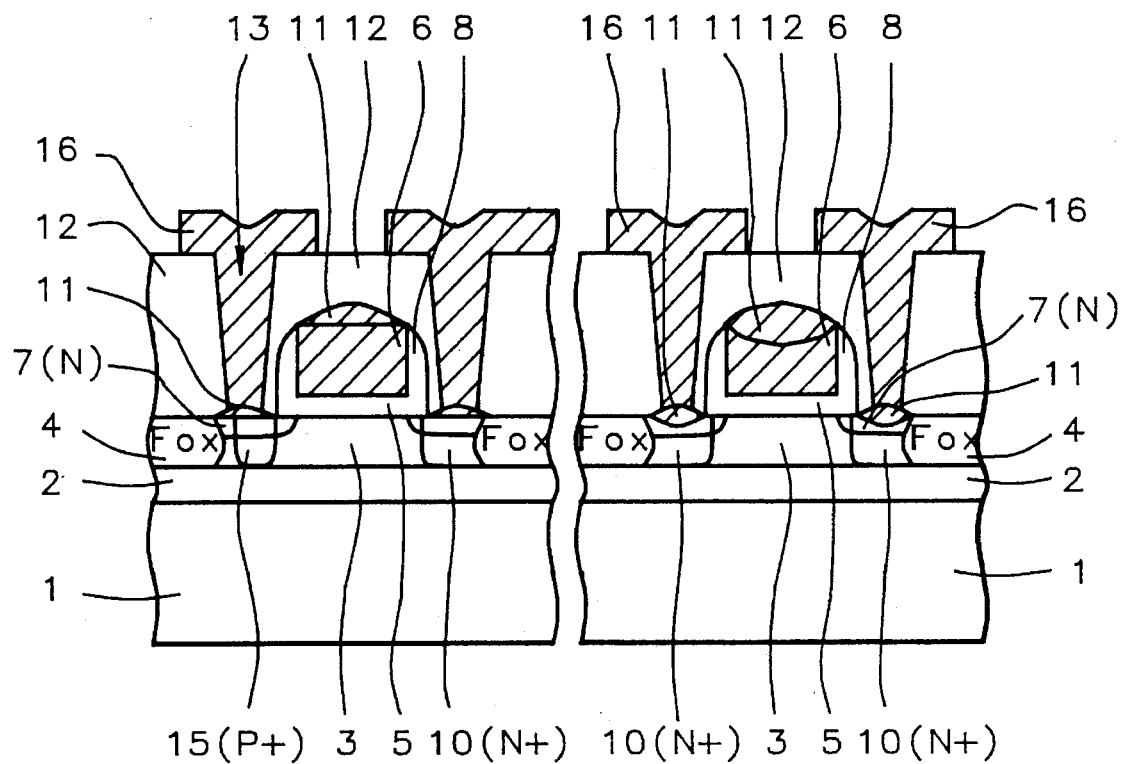
Figure 7:
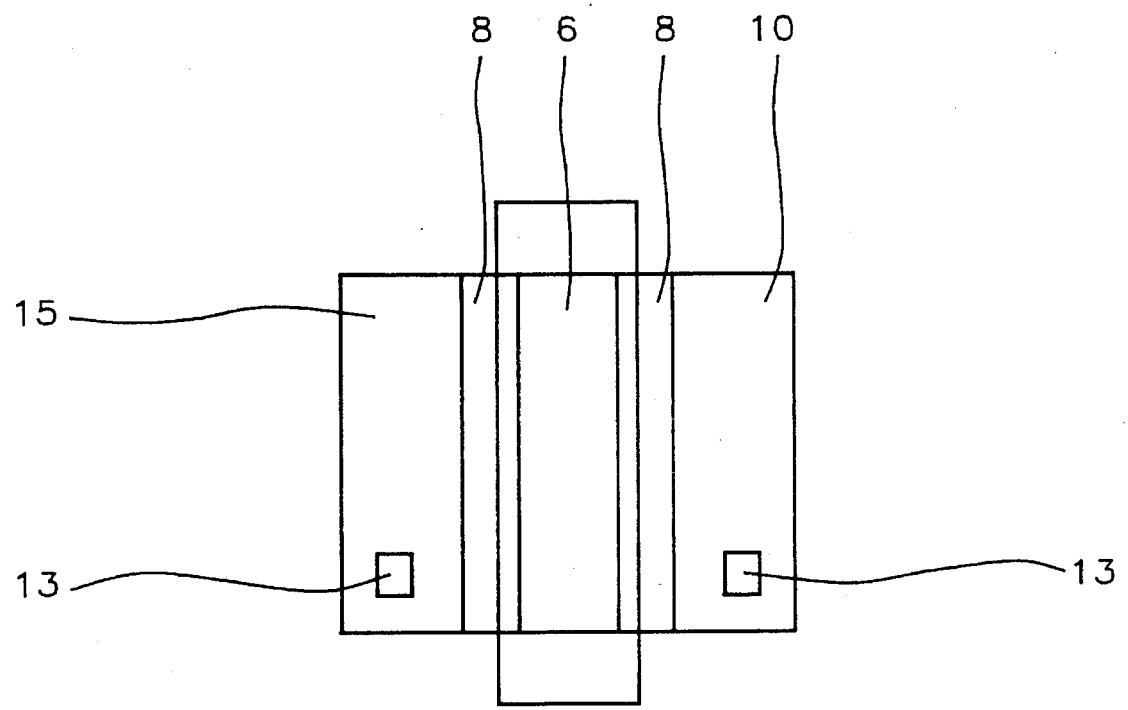
FIG. 7, schematically showing the top view of a MOSFET device, in SOI, with a body contact

A layer of silicon oxide, 12, is deposited using PECVD processing, at a temperature between about 300° to 450° C., to a thickness between about 5000 to 7000 Angstroms. Photolithographic and RIE processing, again using $CHF_3$ as an etchant, are employed to open contact holes, 13, to heavily doped, N type, source and drain regions, 10, as well as to lightly doped, N type region, 7, which will subsequently be converted to a heavily doped P type, body contact. After photoresist removal via plasma oxygen ashing and careful wet cleans, another photoresist masking layer, 14, is used to expose only an area where the body contact will be created. This is accomplished by a ion implantation of $BF_2$, at an energy between about 30 to 80 Kev., at a dose between about 1E14 to 1E16 atoms/cm$^2$. It should be noted that this critical ion implantation step is performed through the titanium silicide, 11, layer. After photoresist removal, again using plasma oxygen ashing wet cleans, another a rapid thermal anneal cycle is used, at a temperature between about 800° to 1100° C., for a time between about 20 to 100 sec., to create heavily doped P type, region, 15, to be used for contact to the P type, SOI layer. This is shown schematically in FIG. 5. The use of a body contact will result in constant drain currents, for a specific range of applied drain voltages. Counterparts, fabricated without body contact, or with body floating, will indicate unwanted or excess drain currents at specific drain voltage conditions, or the "kink" effect. Finally an aluminum based metallization is deposited, using r.f. sputtering, to a thickness between about 4000 to 6000 Angstroms. Standard photolithographic and RIE processing, using a $Cl_2$ containing etchant, is used to create aluminum contact structures, 16. FIG. 6, shows this stage of processing after photoresist removal, via plasma oxygen ashing and careful wet cleans. FIG. 7, schematically shows the top view of the MOSFET device, exhibiting the body contact.

Although this process for fabricating MOSFET devices, with a body contact to the SOI layer, has been shown as part of a N channel, (NFET), device, processing changes can easily be included to use the body contact as part of P channel, (PFET), devices, complimentary, (CMOS), devices, or BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a silicon device in silicon on insulator layer, on a semiconductor substrate, with a contact to said silicon on insulator layer, comprising the steps of:

providing said semiconductor substrate;

providing said silicon on insulator layer, on said semiconductor substrate;

growing field oxide regions in specific areas of said silicon on insulator layer;

growing a first insulator layer the in surface of said silicon on insulator layer, not covered by said field oxide regions;

depositing a polysilicon layer on said first insulator layer and on said field oxide regions;

ion implanting a first imparting dopant of a first conductivity type into said polysilicon layer;

patterning of said polysilicon layer to form a polysilicon gate structure;

ion implanting a second imparting dopant of the first conductivity type into said silicon on insulator layer, not covered by said polysilicon gate structure, and not covered by said field oxide regions;

deposition of a second insulator layer;

anisotropic etching of said second insulator layer to form an insulator sidewall spacer, on the sides of said polysilicon gate structure;

first photoresist masking, to expose a first specific region of said silicon on insulator layer;

ion implantation of a third imparting dopant of the first conductivity type into said first specific region of said silicon on insulator layer, not covered by said first photoresist masking, not covered by said polysilicon gate structure, not covered by said insulator sidewall spaced, and not covered by said field oxide regions;

removal of said first photoresist masking;

deposition of a first metal;

annealing of said first metal to form metal silicide layers on areas where said metal interfaced bare silicon surfaces, while leaving said first metal, unreacted, on areas where said first metal interfaced insulator surfaces;

removal of unreacted said first metal;

deposition of a third insulator layer;

opening contact holes in said third insulator layer, to said first specific regions of said silicon on insulator layer, and to a second specific region of said silicon on insulator layer;

second photoresist masking to expose only second specific region of said silicon on insulator layer;

ion implanting a fourth imparting dopant of a second conductivity type into said second specific region of said silicon on insulator layer, not covered by said second photoresist masking, not covered by said third insulator layer;

removal of said second photoresist masking;

annealing of said semiconductor substrate;

deposition of a second metal; and forming metal contact structures to said first specific regions of said silicon on insulator layer, and to said second specific regions of said silicon on insulator layer.

2. The method of claim 1, wherein said silicon on insulator layer is produced via the SIMOX process, with P type silicon, having a resistivity between about 15 to 25 ohm—cm, a <100> crystallographic orientation, and a thickness between about 1000 to 2000 Angstroms.

3. The method of claim 1, wherein said first insulator layer is silicon dioxide, thermally grown at a temperature between about 800° to 1000° C., in an oxygen steam ambient, to a thickness between about 40 to 200 Angstroms.

4. The method of claim 1, wherein said polysilicon layer is deposited using LPCVD processing, at a temperature between about 500° to 650° C., to a thickness between about 1200 to 3000 Angstroms.

5. The method of claim 1, wherein said first imparting dopant is phosphorous, ion implanted at an energy between about 50 to 100 Kev., at a dose between about 1E14 to 1E16 atoms/cm$^2$.

6. The method of claim 1, wherein said second imparting dopant is arsenic, ion implanted at an energy between about 30 to 80 Kev., at a dose between about 1E12 to 1E14 atoms/cm$^2$.

7. The method of claim 1, wherein said second insulator layer is silicon oxide, deposited using LPCVD or PECVD processing, at a temperature between about 600° to 800° C., to a thickness between about 800 to 2500 Angstroms.

8. The method of claim 1, wherein said third imparting dopant is arsenic, ion implanted at an energy between about 30 to 80 Kev., at a dose between about 1E14 to 1E16 atoms/cm$^2$.

9. The method of claim 1, wherein said first metal is titanium, deposited using r.f. sputtering, to a thickness between about 200 to 300 Angstroms.

10. The method of claim 1, wherein annealing, used to form said metal silicide, is performed using a conventional furnace at a temperature between about 500° to 700° C., for a time between about 10 to 30 min.

11. The method of claim 1, wherein annealing, used to form said metal silicide, is performed using rapid thermal annealing, at a temperature between about 600° to 900° C., for a time between about 30 to 120 sec.

12. The method of claim 1, wherein unreacted, said first metal, is removed using a solution of about 5 parts water, to about 1 part hydrogen peroxide, to about 1 part ammonium hydroxide, at a temperature between about 50° to 75° C.

13. The method of claim 1, wherein said fourth imparting dopant is BF$_2$, ion implanted at an energy between about 30 to 80 Kev., at a dose between about 1E14 to 1E16 atoms/cm$^2$.

14. A method for fabricating a MOSFET device, in silicon on insulator layer, on a semiconductor substrate, with a body contact to said silicon on insulator layer, comprising the steps of:

providing said semiconductor substrate;

providing said silicon on insulator layer, on said semiconductor substrate;

growing field oxide regions in specific areas of said silicon on insulator layer;

growing a first insulator layer in the surface of silicon on insulator layer, not covered by said field oxide regions;

depositing a polysilicon layer on said first insulator layer and on said field oxide regions;

ion implanting a first imparting dopant of a first conductivity type into said polysilicon layer;

patterning of said first polysilicon layer to form as polysilicon gate structure;

ion implanting a second imparting dopant of a first conductivity type into said silicon on insulator layer, not covered by said polysilicon gate structure, and not covered by said field oxide regions, to form lightly doped source and drain regions of said MOSFET device;

deposition of a second insulator layer;

anisotropic etching of said second insulator layer to form insulator sidewall spacer, on the sides of said polysilicon gate structure;

first photoresist masking to expose a first specific region of silicon on insulator layer;

ion implanting a third imparting dopant of the first conductivity type into said first specific region of said silicon on insulator layer, not covered by said first photoresist masking, not covered by said polysilicon gate structure, not covered by said insulator sidewall spacer, and not covered by said field oxide regions, to form heavily doped source and drain regions of said MOSFET device;

removal of said first photoresist masking;

deposition of a titanium layer;

annealing of said titanium layer to form titanium disilicide on areas where said titanium interfaced bare silicon surfaces, while leaving unreacted, said titanium, on areas where said titanium interfaced insulator surfaces;

removal of unreacted, said titanium layer;

deposition of a third insulator layer;

opening contact holes in said third insulator layer to said heavily doped source and drain regions, and to said lightly doped region, of said MOSFET device;

second photoresist masking to expose only said lightly doped source and drain region, of said MOSFET device;

ion implanting a fourth imparting dopant of a second conductivity type into said lightly doped source and drain region, of said MOSFET device, not covered by said second photoresist masking, and not covered by said third insulator layer, to form body contact region in said silicon on insulator layer;

removal of said second photoresist masking;

annealing of said semiconductor substrate;

deposition of a metal; and forming metal contact structures to said heavily doped source and drain regions, and to said body contact, of said MOSFET device, in said silicon on insulator layer.

15. The method of claim 13, said silicon on insulator layer is produced by the SIMOX process, with a P type silicon on insulator layer, with a resistivity between about 15 to 25 ohm—cm, a <100> crystallographic orientation, and a thickness between about 1000 to 2000 Angstroms.

16. The method of claim 14, wherein said first insulator is silicon dioxide, thermally grown in an oxygen—steam ambient, at a temperature between about 800° to 1000° C., a thickness between about 40 to 200 Angstroms.

17. The method of claim 14, wherein said polysilicon layer is deposited using LPCVD processing, at a temperature between about 500° to 650° C., to a thickness between about 1200 to 3000 Angstroms.

18. The method of claim 14, wherein said first imparting dopant is phosphorous, ion implanted at an energy between about 50 to 100 Kev., at a dose between about 1E14 to 1E16 atoms/cm$^2$.

19. The method of claim 14, wherein said second imparting dopant, used to create said lightly doped source and drain regions in said MOSFET device, is arsenic, ion implanted at an energy between about 30 to 80 Kev., at a dose between about 1E12 to 1E14 atoms/cm$^2$.

20. The method of claim 14, wherein said second insulator layer is silicon oxide deposited using LPCVD or PECVD processing, at a temperature between about 600° to 800° C., to a thickness between about 800 to 2500 Angstroms.

21. The method of claim 14, wherein said third imparting dopant, used to create said heavily doped source and drain regions in said MOSFET device, is arsenic, ion implanted at an energy between about 30 to 80 Kev., at a dose between about 1E14 to 1E16 atoms/cm$^2$.

22. The method of claim 14, wherein said titanium layer is deposited using r.f. sputtering, to a thickness between about 200 to 300 Angstroms.

23. The method of claim 14, wherein annealing, used to form said titanium disilicide layer, is performed using a conventional furnace, at a temperature between about 500° to 700° C., for a time between about 10 to 30 min.

24. The method of claim 14, wherein annealing, used to form said titanium disilicide layer, is performed using rapid thermal annealing, at a temperature between about 600° to 900° C., for a time between about 30 to 120 sec.

25. The method of claim 14, wherein unreacted, said titanium layer, is removed using a solution of about 5 parts water, to about 1 part hydrogen peroxide, to about 1 part ammonium hydroxide, at a temperature between about 50° to 75° C.

26. The method of claim 14, wherein said fourth imparting dopant, used to create said body contact region, in said MOSFET device, is BF$_2$, ion implanted at an energy between about 30 to 80 Kev., at a dose between about 1E14 to 1E16 atoms/cm$^2$.

* * * * *